United States Patent [19]
Colin

[11] 3,805,091
[45] Apr. 16, 1974

[54] FREQUENCY SENSITIVE CIRCUIT EMPLOYING VARIABLE TRANSCONDUCTANCE CIRCUIT

[75] Inventor: Dennis P. Colin, Beverly, Mass.

[73] Assignee: ARP Instruments, Inc., Newton Highlands, Mass.

[22] Filed: June 15, 1972

[21] Appl. No.: 263,177

[52] U.S. Cl. ............... 307/295, 330/30 D, 330/109, 307/229, 328/167

[51] Int. Cl. ............................................ H03b 1/04

[58] Field of Search .......... 330/30 D, 109; 328/167; 307/295, 229

[56] References Cited

UNITED STATES PATENTS

| | | | |
|---|---|---|---|
| 3,638,037 | 1/1972 | McMurtrie | 307/295 X |
| 3,649,926 | 3/1972 | Hill | 330/30 D |
| 3,668,538 | 6/1972 | Hearn | 330/30 D |
| 3,668,543 | 6/1972 | Bailey | 330/30 D |
| 3,699,464 | 10/1972 | Zobel | 330/30 D |

*Primary Examiner*—John S. Heyman

[57] ABSTRACT

The circuit of the present invention is preferably used in electronic musical instruments such as an electronic organ or music synthesizer, and basically comprises a transconductance means, an integrator, and feedback means intercoupling an output of the integrator and an input of the transconductance means. The transconductance means includes a differential amplifier and current reflector and the integrator comprises an operational amplifier and reactance means. The fundamental circuit is primarily used for voltage controlled filtering and may be easily modified to provide either a high pass filter network, a low pass filter network, or a phase shift network with constant gain.

19 Claims, 8 Drawing Figures

FREQUENCY SENSITIVE CIRCUIT EMPLOYING VARIABLE TRANSCONDUCTANCE CIRCUIT

BACKGROUND OF THE INVENTION

The present invention relates in general to electronic circuits preferably adapted for use in electronic musical instruments, and primarily adapted to provide variable signal filtering wherein the frequency response may be controlled by an applied voltage or current control signal. More particularly, the fundamental circuit arrangement of the present invention with feedback may be readily modified to provide for either high pass, low pass or phase shift operation.

There are numerous types of filter circuits known in the prior art, many of which are rather complex and expensive to fabricate. For polyphonic musical instruments a plurality of filter circuits are necessary and the use of costly filter circuits can add to the fabrication cost of the instrument. Thus, there is a definite need for a low cost variable filter circuit. Also, in the design of many filter circuits the configuration of a high pass and low pass, for example, filter is sufficiently different so that they are not readily substituted one for the other. Thus, it would be advantageous to have a filter circuit that is relatively inexpensive and that is also easily modified so as to provide high pass and low pass filtering and also phase shift operation at constant gain.

OBJECTS OF THE INVENTION

Accordingly, it is an object of the present invention to provide an improved electronic circuit with feedback preferably for use in an electronic musical instrument and primarily adapted for filtering purposes.

Another object of the present invention is to provide an electronic circuit in accordance with the preceding object that is relatively simple in construction and that may also be fabricated relatively inexpensively.

A further object of the present invention is to provide an electronic circuit as set forth in the preceding objects and that is easily modified to provide either high pass filtering, low pass filtering or phase shift operation at constant gain.

SUMMARY OF THE INVENTION

To accomplish the foregoing and other objects of the present invention, the electronic circuit of the present invention which is preferably used in an electronic musical instrument such as a musical organ or synthesizer, basically comprises a transconductance means having a signal terminal, a control terminal and an output terminal, an integrator coupled from the output terminal of the transconductance means, and a feedback path which couples from the output of the integrator to the transconductance means. In a preferred embodiment in accordance with the invention, the transconductance means includes a differential amplifier and a current reflector, and the integrator includes a conventional operational amplifier and associated reactance coupled thereacross.

Low pass filtering is provided when the input signal is coupled to the differential amplifier comprising the transconductance means with one input to the operational amplifier being grounded. In order to modify the circuit to provide high pass filtering the input signal is coupled to the operational amplifier rather than to the differential amplifier. To provide phase shift operation the input signal is coupled to both the operational amplifier and the differential amplifier comprising the transconductance means.

The circuit of the present invention may also be operated as a shaped transient generator by applying the proper predetermined voltage patterns to the signal and control inputs.

BRIEF DESCRIPTION OF THE DRAWINGS

Numerous other objects, features and advantages of the invention will now become apparent upon a reading of the following detailed description taken in conjunction with the accompanying drawings in which.

DETAILED DESCRIPTION

Figures 1, 2:
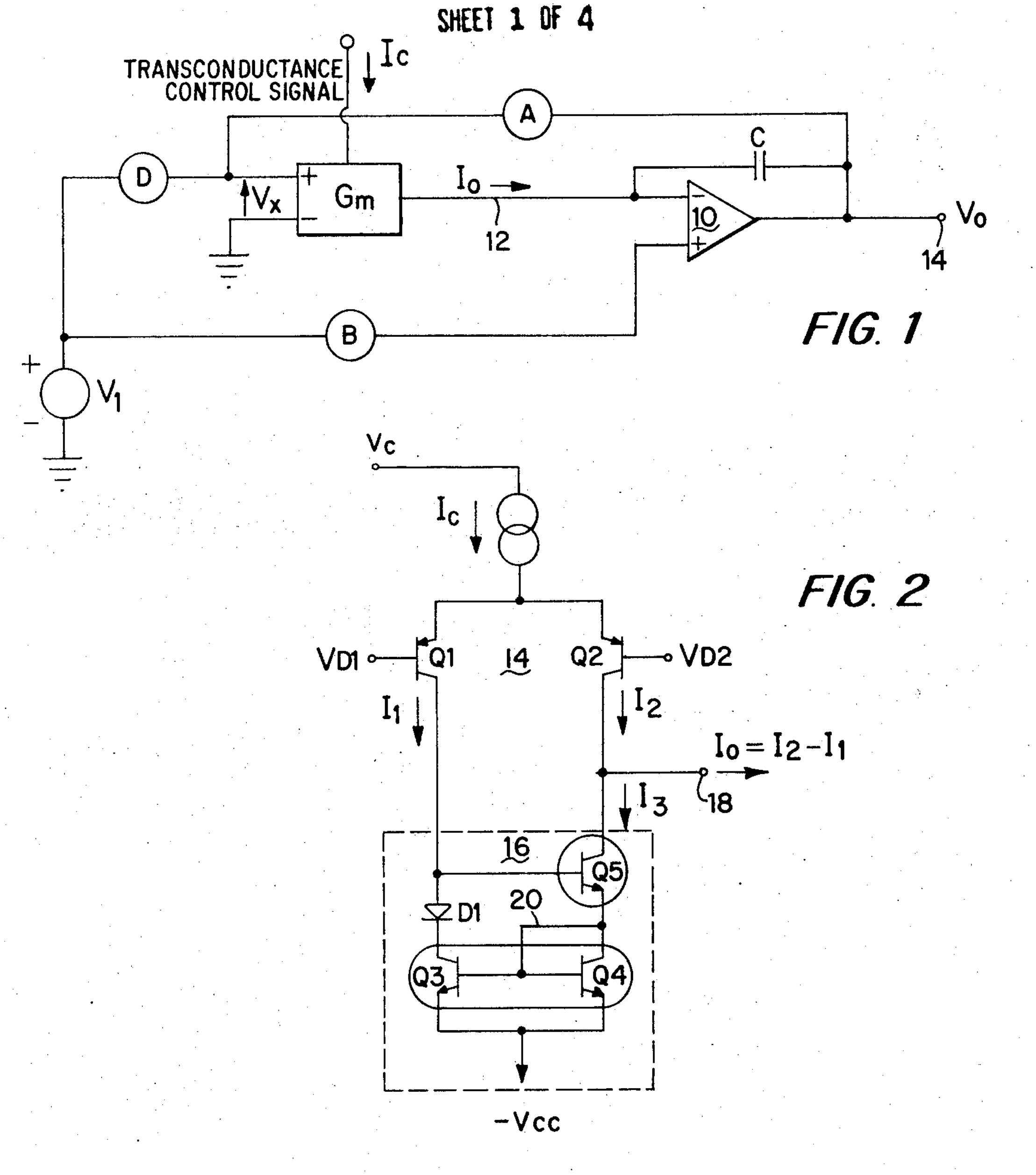
FIG. 1 is a general schematic block diagram of the circuit of the present invention.
FIG. 2 is a circuit diagram of one embodiment of the transconductance means of FIG. 1.

Referring now to the drawings and in particular to FIG. 1, there is shown a general schematic block diagram of the circuit of the present invention. The circuit basically includes a transconductance means $G_m$ and an operational amplifier 10 which may be of conventional design. The circuit also includes blocks A, B and D, each of which represents a circuit gain. The values of these gains and the relationships therebetween are discussed in more detail hereinafter with reference to FIGS. 2, 5 and 6. By the proper choice of these circuit gains either high pass, low pass or phase shift operation is obtained.

In FIG. 1 the signal source $V_1$ has one side connected to ground and the other side coupled by way of box B to the positive input of operational amplifier 10, and by way of box D to the positive input of transconductance means $G_m$. The negative input to the transconductance means is grounded and the output couples by way of line 12 to the negative input of operational amplifier 10. The operational amplifier 10 along with the capacitor C which couples thereacross comprises an integrator with the output of amplifier 10 coupled to output terminal 14 ($V_o$ output). The circuit of FIG. 1 also includes a feedback path including box A which couples from the output of amplifier 10 to the positive input of the transconductance means.

The following is a derivation of the voltage transfer function $V_o/V_1$ for the general circuit of FIG. 1. After this transfer function is derived then the necessary gain values and the interrelation therebetween can be determined for the different types of operations that may be desired. The following three equations define the circuit of FIG. 1 in terms of $V_1$, $V_x$, $V_o$, and $I_o$.

$$V_x + DV_1 + AV_o \quad (1)$$

$$I_o = G_m V_x \quad (2)$$

$$V_o = BV_1 - I_o/SC \quad (3)$$

where S is the complex frequency operator $\sigma + j\,\omega$

By appropriate substitution the voltage transfer function for the circuit of FIG. 1 is:

$$V_o/V_1 = BSC - G_mD/SC + G_mA \quad (4)$$

For the low pass filter arrangement $B=O$, $A=D$, and the voltage transfer function is:

$$V_o/V_1 = -G_mA/SC + G_mA \quad (5)$$

Equation (5) is the equation for a low pass filter and has a DC gain of −1, and a 3db cutoff frequency of $\omega = G_mA/C$.

For the high pass filter arrangement $D=0$, $B=1$, and the voltage transfer function is:

$$V_o/V_1 = SC/SC + G_mA \quad (6)$$

Equation (6) is the typical equation for a high pass filter with a high frequency gain of 1, and 3db cutoff frequency of $G_mA/C$.

The third case applies to a phase shift network wherein $B=1$, $A=D$, and the voltage transfer function is:

$$V_o/V_1 = SC{=}G_mA/SC{+}G_mA\ ,\ \phi\ V_o/V_1 = 180° - 2\tan^{-1}\omega/\omega_o\ , \quad (7)$$

where $\omega_0 = G_mA/C$. This transfer function shows that the frequency response is flat with a gain of one but that the phase varies from 180° at DC to 0° at high frequencies, and is 90° where $\omega = G_mA/C$.

The three above cases of high pass, low pass and phase shift operation are discussed in more detail hereinafter with reference to FIGS. 4–6.

Referring now to FIG. 2 there is shown a circuit diagram of one embodiment of the transconductance means of FIG. 1. This transconductance means includes a differential amplifier 14 and a current reflector 16. The differential amplifier typically includes matched transistors Q1 and Q2 with the emitters of each transistor intercoupled and receiving a control current $I_c$ which is preferably fed from an exponential voltage-controlled current generator. In the circuit of the present invention the base of transistor Q1 is normally grounded and the input signal may be provided at the base of transistor Q2. The collector currents of transistor Q1 and Q2 are respectively referred to as currents $I_1$ and $I_2$.

The current reflector 16 comprises matched transistors Q3 and Q4 with their base and emitter electrodes respectively interconnected. The collectors of transistors Q3 and Q4 connect to the cathode of diode D1 and the emitter of transistor Q5, respectively. The base of transistor Q5 couples to the anode of diode D1 and also to the collector of transistor Q1. The collector of transistor Q5 couples to the collector of transistor Q2 and also to the output terminal 18.

The current reflector 16 is designed so that the current $I_3$ is approximately equal to the current $I_1$. Therefore, the output current $I_o$ is approximately equal to $I_2 - I_1$.

From the known equations associated with the differential amplifier configuration of FIG. 2 it can be shown that:

$$I_2 - I_1 \approx I_o \approx I_C \nabla V_b\ ^{q/2KT} \quad (8)$$

where $q$ is the charge of the electron, $K$ is Boltzman's constant, T is Absolute Temperature in Kelvin degrees, and thus $q/2$KT is a constant.

The relationship shown in equation (8) assumes that transistors Q1 and Q2 and transistors Q3 and Q4 are well matched and operated at the same temperature. Also, it is assumed that the current gains of transistors Q1 – Q5 are high (greater than 100) and the magnitude of the $\Delta V_b$ is small (less than 26 millivolts). These conditions can be easily achieved with accuracies from 1 percent to 10 percent.

Thus, the circuit of FIG. 2 provides a current controlled transconductive means wherein the relationship between the output current and the input voltage is controlled by the control current $I_c$. It is noted also with respect to FIG. 2 that the current reflector rejects common mode current $(I_1+I_2=I_c)$ at the output terminal 18.

One of the features of the present invention resides in the novel current reflector 16 which includes matched transistors Q3 and Q4 which have a relatively high beta ($H_{FE}$) and are matched for equal beta and equal $V_{eb}$ at the same emitter currents. It is noted that an interconnection line 20 is coupled from the base to the collector of transistor Q4 so as to establish essentially no base to collector voltage thereacross. The diode D1 assures that the base-collector voltage across transistor Q3 is essentially zero. Transistor Q5 provides a common base, current follower which allows the output to be at any voltage while keeping essentially zero volts between the collector and base of transistors Q3 and Q4. Since the betas of the transistors are matched all the base currents cancel with respect to the emitter currents of transistors Q3 and Q4 and the currents $I_1$ and $I_3$ are therefore equal.

For the sake of simplicity most of the currents and voltages referred to herein are designated by steady state values. It should be understood, however, that the control current, for example, would probably be considered as instantaneously varying in a predetermined manner to control the output current $I_o$ and in turn the output voltage $V_o$.

Figure 4:
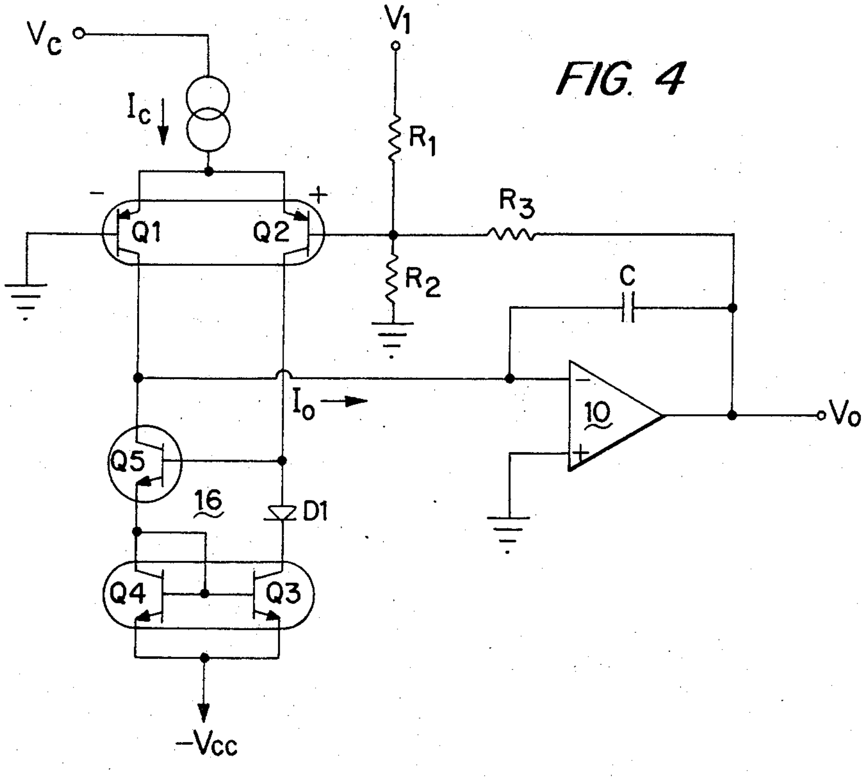
FIG. 4 is a circuit diagram of a low pass filter constructed in accordance with the principles of this invention.

Referring now to FIG. 4, there is shown a circuit diagram of a low pass filter circuit constructed in accordance with the principles of the present invention. The transconductance means shown in FIG. 4 is essentially the same as that previously discussed with reference to FIG. 2 and includes a differential amplifier including transistors Q1 and Q2 and a current reflector 16.

As indicated before with reference to FIG. 1, for the low pass embodiment the gain $B$=0, meaning that there is no connection of the input signal to the operational amplifier, and the gains A and D are equivalent. Thus, the positive input to operational amplifier 10 is grounded and receives no input from source $V_1$.

In FIG. 4 the following gain equations may be defined:

$$A = R2/R3 \qquad (9)$$

$$D = R2/R1 \qquad (10)$$

Thus, by imposing the constraint that R1 is equal to R3 the low pass embodiment represented by equation (5) is provided.

For this embodiment the voltage transfer function $V_o/V_1$ is shown hereinbefore in equation (5). It can also be shown that the cut-off frequency $F_c$ is expressed by the following equation:

$$F_c = AI_c/0.327C \qquad (11)$$

Thus, the cut-off frequency is directly related to the control current. At the higher control currents more high frequency components of the input signal are passed and at lower control currents fewer high frequency components of the signal are passed.

Figure 3:
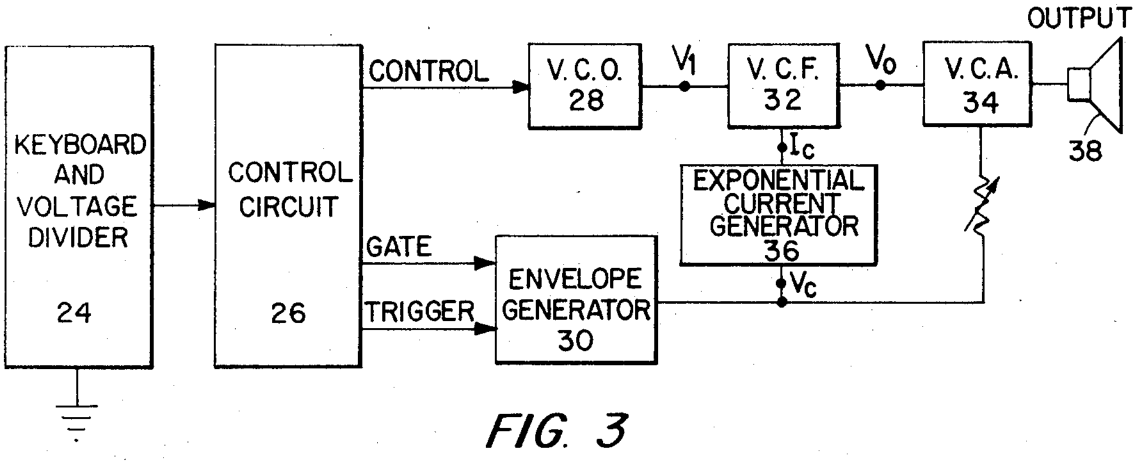
FIG. 3 is a block diagram depicting one embodiment of the filter circuit of the present invention in use in an electronic musical system.

Referring now to FIG. 3 there is shown a block diagram of a typical electronic music system embodying a voltage-controlled filter 32 constructed in accordance with the principles of the present invention. The filter shown in FIG. 3 is actually controlled by current $I_c$. However, in the art the term "voltage controlled filter" often includes what has been shown separately in FIG. 3 as an exponential current generator 36. The control voltage $V_c$ is actually applied to the exponential current generator 36 for generating a control current $I_c$ which doubles for each one volt increase in $V_c$, for example.

The system basically comprises a keyboard and voltage divider 24 which couples to a control circuit 26 for generating control, gate and trigger signals. The control signal couples to a voltage controlled oscillator 28 and the output of the oscillator couples to the $V_1$ input of filter 32. The output of the filter 32 couples to a voltage-controlled amplifier 34 and an output speaker 38. The gate and trigger outputs from control circuit 26 couple to a transient generator 30 and the output of the transient generator may couple to both amplifier 34 and exponential current generator 36. One embodiment for an exponential current generator is depicted in U.S. Pat. No. 3,444,362. As indicated previously, the purpose of generator 36 is to provide an exponentially increasing control current from the linearly increasing control voltage from generator 30. Because the cut-off frequency of filter 32 is directly related to the control current, the cut-off frequency therefore doubles for each one volt increase in the control voltage.

Figure 8:
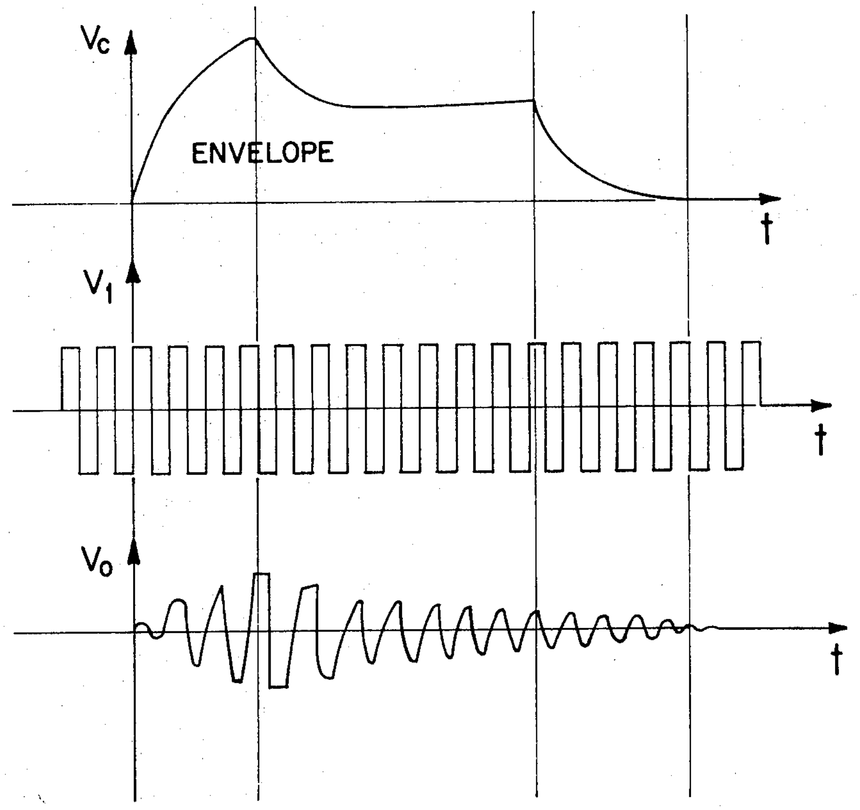
FIG. 8 shows various waveforms associated with the block diagram of FIG. 3.

Referring now to FIG. 8 there are shown typical waveforms associated with the block diagram of FIG. 3. One of the waveforms shows the voltage $V_c$ with reference to time observed at the output of the transient generator. The second waveform is a typical output from voltage-controlled oscillator 28 and is shown as a square wave that traverses both positively and negatively. The third waveform shows the resultant voltage $V_o$. In this waveform it is noted that the higher harmonics of the square wave are passed at higher control currents. When the control current decreases the output voltage approaches a triangular wave. In one embodiment, if two or more filters are cascaded, the output at low control currents can approach a pure sine wave.

Figure 5:
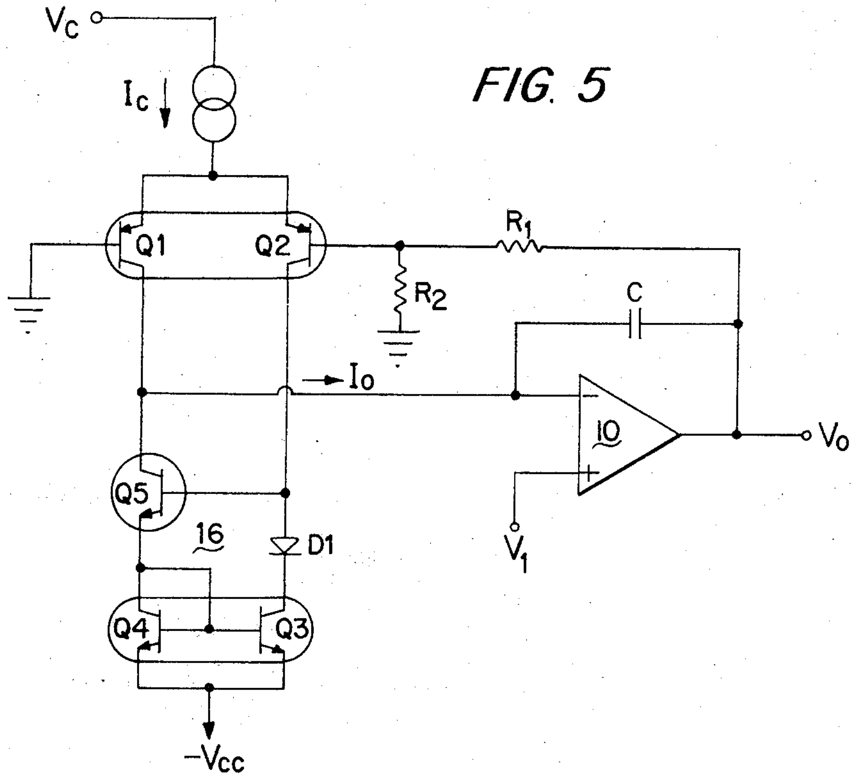
FIG. 5 is a circuit diagram of a high pass filter constructed in accordance with the principles of this invention.

Referring now to FIG. 5 there is shown a circuit diagram of a high pass filter. The basic components of the circuit are the same as shown in FIG. 4 with the exception that the input signal $V_1$ is coupled to the positive input of operational amplifier 10 rather than to the base of transistor Q2 of the transconductance means. Also, the feedback line coupled from the output of the operational amplifier includes a resistor R1 connected to the base of transistor Q2. Resistor R2 also couples from the base of transistor Q2 to ground. The current reflector 16 is identical in design to the one shown in FIG. 4.

As indicated before, with reference to FIG. 1, for the high pass filter the gain $D$=0, meaning that the input signal is not coupled to the transconductance means, and the gain $B$=$1$. The positive input to the operational amplifier receives the $V_1$ signal.

In FIG. 5 the following gain equation may be defined:

$$A = R2/R1 \qquad (12)$$

The gain A determines the percentage voltage feedback from the output of the amplifier to the transconductance means.

For this high pass embodiment the voltage transfer function is shown in equation (6) and the cut-off frequency is represented by equation (11). Thus, the cut-off frequency is a function of the control current $I_c$.

Figure 6:
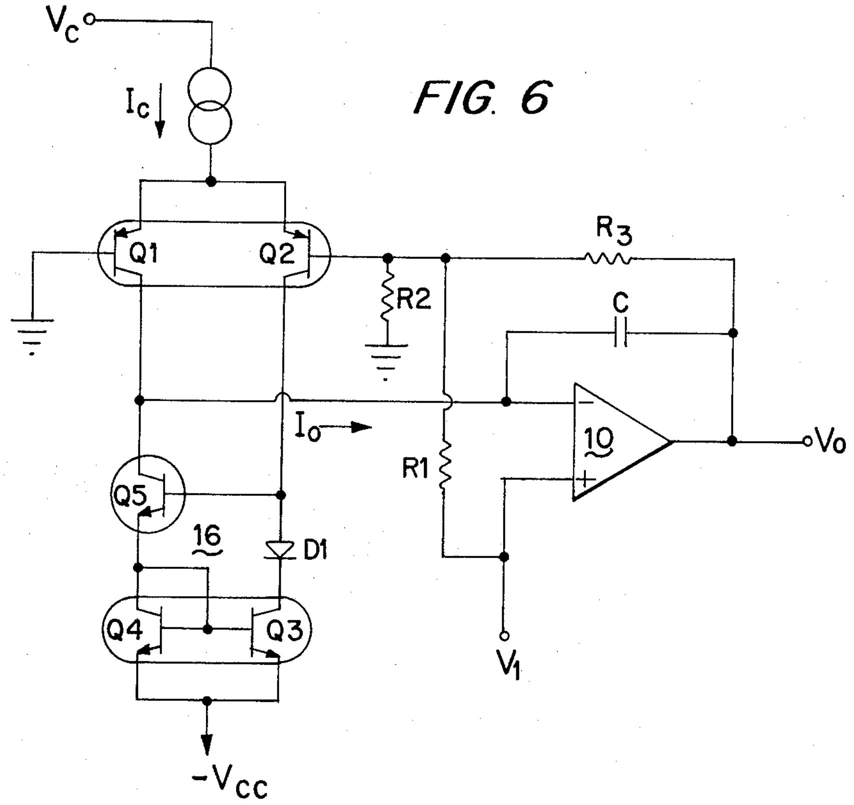
FIG. 6 is a circuit diagram of a phase shift network with constant gain constructed in accordance with the principles of this invention.

In FIG. 6 there is shown a circuit diagram for the phase shift network of the present invention. This circuit is similar to the circuits shown in FIGS. 4 and 5 and basically includes the transconductance means $G_m$, current reflector 16, and operational amplifier 10. However, in this circuit, the input signal $V_1$ is coupled to operational amplifier 10 and also via resistor R1 to the transconductance means. The feedback includes the voltage divider pair of resistors R2 and R3 connected the same as resistors R1 and R2 in FIG. 5.

As indicated previously, for the phase shift network $B$=1 and $A$ =$D$. Thus, the input signal couples to both the operational amplifier and the transconductance means.

In FIG. 6 the following gain equations may be defined:

$$A = R2/R3 \qquad (13)$$

$$D = R2/R1 \qquad (14)$$

In designing this circuit by providing $A$ =$D$, the values of R3 and R1 are the same. For this embodiment the voltage transfer function is shown in equation (7). The phase shift changes with frequency from 180° at DC to 0° at high frequencies.

Figure 7:
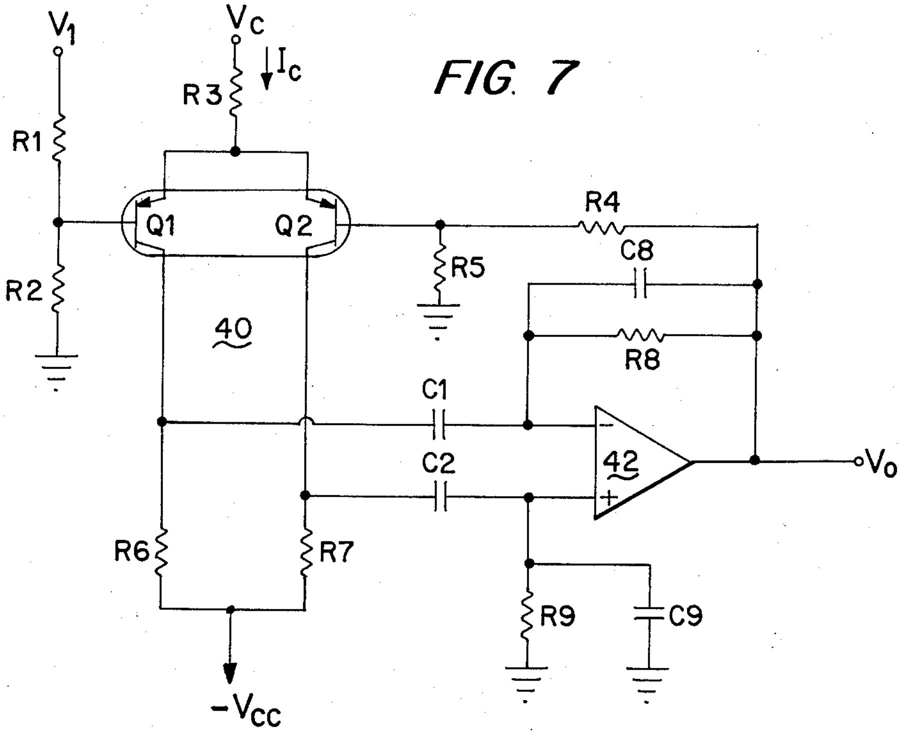
FIG. 7 shows a circuit diagram of another embodiment of a high pass filter.

FIG. 7 shows still another embodiment for a high pass filter. This circuit comprises a differential amplifier 40 having biasing resistors associated therewith and having the input signal $V_1$ coupled to transistor Q1 via resistor R1. The outputs of the amplifier 40 taken at the collector electrodes of transistors Q1 and Q2 couple via capacitors C1 and C2, respectively to the negative and positive inputs of operational amplifier 42. A first RC filter network including resistor R9 and capacitor C9 couples to the positive input of amplifier 42. A second RC filter network including R8 and capacitor C8 couples across amplifier 42, as shown. The feedback to the differential amplifier includes resistors R4 and R5. The high pass filtering is primarily provided by capacitors C1 and C2.

What is claimed is:

1. A transconductance circuit comprising;

difference circuit means having at least one input terminal and first and second output lines, a pair of transistors each having a control electrode and a pair of output electrodes, said control electrodes being intercoupled, a diode having one side coupled to the first output line and the other side coupled to one of the output electrodes of the first transistor of said pair, and a third transistor having its control electrode coupled to the first output line, one output electrode coupled to an output electrode of the second transistor of said pair, and the other output electrode coupled to the second output line.

2. The circuit of claim 1 wherein all said transistors are NPN transistors and the anode of said diode couples to the first output line.

3. The circuit of claim 2 comprising a conductor coupling between the control electrode and one of the output electrodes of said second transistor.

4. The circuit of claim 3 wherein the emitter electrodes of said pair of transistors are intercoupled.

5. A circuit comprising;

a transconductance means including a difference circuit having at least one input terminal and first and second output lines, said transconductance means having an output terminal defined at one of said output lines, said transconductance means further including a pair of transistors each having a control electrode and a pair of output electrodes, said control electrodes being intercoupled, a diode having one side coupled to the first output line and the other side coupled to one of the output electrodes of the first transistor of said pair, and a third transistor having its control electrode coupled to the first output line, one output electrode coupled to an output electrode of the second transistor of said pair, and the other output electrode coupled to the second output line, an amplifier coupled from the output terminal of said transconductance means, and feedback means coupling from the output of the amplifier to the input terminal of the transconductance means.

6. The circuit of claim 5 for use as a low pass filter wherein an input signal is coupled to the same input terminal of the transconductance means as is the feedback means.

7. The circuit of claim 6 wherein said feedback means includes a resistor voltage divider and comprising an input resistor coupling the input signal to the transconductance means wherein said input resistor and one of the resistors of said voltage divider are substantially the same in value.

8. The circuit of claim 5 for use as a high pass filter wherein an input signal is coupled to one of the inputs of the integrator and the output terminal of the transconductance means couples to a second input of the integrator.

9. The circuit of claim 8 wherein said feedback means includes a resistor voltage divider.

10. The circuit of claim 5 for use as a phase shift circuit wherein an input signal is coupled to both the integrator and the transconductance means.

11. The circuit of claim 10 wherein said feedback means includes a resistor voltage divider and an input resistor coupled to the transconductance means wherein the input resistor has about the same value as one of the resistors of the dividers.

12. The circuit of claim 5 for use as a high pass filter wherein an input signal is coupled to one of the inputs of the transconductance means and the feedback means is coupled to another input of the transconductance means.

13. The circuit of claim 5 wherein said integrator means includes reactance means and an operational amplifier.

14. The circuit of claim 13 wherein said reactance means includes a capacitor.

15. The circuit of claim 12 comprising reactance means intercoupling the output of the transconductance means to the input of the amplifier.

16. The circuit of claim 15 wherein said reactance means includes a pair of capacitors coupling to separate inputs of said amplifier, and an RC filter network coupled to one input of said amplifier.

17. An active low pass filter circuit having a variable frequency response and comprising;

a variable transconductance means including a circuit means having a pair of useable inputs one of which is for receiving an input signal, a control terminal for receiving a variable control signal for controlling the transconductance, and an output terminal, an integrating amplifier having an input terminal coupled from the output terminal of said transconductance means and having an output terminal, and feedback means coupling from the output terminal of the amplifier to one of the inputs of the transconductance means, one of said variable transconductance means, amplifier and feedback means including signal inversion means, the output signal being taken at the output terminal of the amplifier, being a function of the input signal and having a frequency characteristic determined by the control signal, the frequency response of said circuit being defined by the voltage transfer function, $$Vo/V1 = -GmA/SC + GmA$$

where $Vo$ = output voltage; $V1$ = input voltage; $Gm$, $A$ and $C$ are determinable constants; and s is the La Place operator or variable.

18. An active high pass filter circuit having a variable frequency response and comprising;

a variable transconductance means including a circuit means having a pair of useable inputs, a control terminal for receiving a variable control signal for controlling the transconductance, and an output terminal, an integrating amplifier having an input terminal coupling from the output terminal of said transconductance means, a second input terminal for receiving an input signal and an output terminal, and feedback means coupling from the output terminal of the amplifier to one of the inputs of the transconductance means, one of said variable transconductance means, amplifier and feedback means including signal inversion means, the output signal being taken at the output terminal of the amplifier, being a function of the input signal and having a frequency characteristic determined by the control signal, the frequency response of said circuit being defined by the voltage transfer function, $$Vo/V1 = sC/sC + GmA$$

where $Vo$ = output voltage; $V1$ = input voltage; $Gm, A$ and $C$ are determinable constants; and s is the LaPlace operator or variable.

19. An active phase shift circuit having a variable phase shift response and comprising;

a variable transconductance means including a circuit means having a pair of useable inputs one of which is for receiving an input signal, a control terminal for receiving a variable control signal for controlling the transconductance and an output terminal, an integrating amplifier having an input terminal coupled from the output terminal of said transconductance means, a second input terminal for receiving the input signal, and an output terminal, and feedback means coupling from the output terminal of the amplifier to one of the inputs of the transconductance means, one of said variable transconductance means, amplifier and feedback means including signal inversion means, the output signal being taken at the output terminal of the amplifier, being a function of the input signal and having a frequency response determined by the control signal, the frequency versus phase response of the circuit being defined by the voltage transfer function, $$Vo/V1 = sC - GmA/sC + GmA$$

where $Vo$ = output voltage; $V1$ = input voltage; $Gm, A$ and $C$ are determinable constants; and s is the LaPlace operator or variable.

* * * * *